United States Patent
Glass et al.

(10) Patent No.: US 10,290,709 B2
(45) Date of Patent: May 14, 2019

(54) APPARATUS AND METHODS TO CREATE AN INDIUM GALLIUM ARSENIDE ACTIVE CHANNEL HAVING INDIUM RICH SURFACES

(71) Applicant: Intel Corporation, Santa Clara, CA (US)

(72) Inventors: Glenn A. Glass, Portland, OR (US); Anand S. Murthy, Portland, OR (US); Chandra S. Mohapatra, Hillsboro, OR (US); Tahir Ghani, Portland, OR (US); Willy Rachmady, Beaverton, OR (US); Gilbert Dewey, Hillsboro, OR (US); Matthew V. Metz, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/504,280

(22) PCT Filed: Sep. 19, 2014

(86) PCT No.: PCT/US2014/056526
§ 371 (c)(1),
(2) Date: Feb. 15, 2017

(87) PCT Pub. No.: WO2016/043769
PCT Pub. Date: Mar. 24, 2016

(65) Prior Publication Data
US 2017/0229543 A1 Aug. 10, 2017

(51) Int. Cl.
*H01L 29/10* (2006.01)
*H01L 29/78* (2006.01)
(Continued)

(52) U.S. Cl.
CPC .... *H01L 29/1054* (2013.01); *H01L 21/76224* (2013.01); *H01L 29/045* (2013.01);
(Continued)

(58) Field of Classification Search
CPC ........ H01L 29/1025–29/1054; H01L 2/66522; H01L 29/66446; H01L 29/66795; H01L 29/785; H01L 29/7855; H01L 29/831
See application file for complete search history.

(56) References Cited

U.S. PATENT DOCUMENTS 5,633,516 A * 5/1997 Mishima ............... H01L 29/205
257/190
8,114,746 B2 2/2012 Wei et al.
(Continued)

FOREIGN PATENT DOCUMENTS

JP 06069248 * 3/1994
JP 2002151688 5/2002
(Continued)

OTHER PUBLICATIONS

International Preliminary Report on Patentability and Written Opinion received for PCT Patent Application No. PCT/US2014/056526, dated Mar. 30, 2017, 9 pages.
(Continued)

*Primary Examiner* — Thanhha S Pham
(74) *Attorney, Agent, or Firm* — Green, Howard & Mughal, LLP

(57) ABSTRACT

Transistor devices having indium gallium arsenide active channels, and processes for the fabrication of the same, that enables improved carrier mobility when fabricating fin shaped active channels, such as those used in tri-gate or gate all around (GAA) devices. In one embodiment, an indium gallium arsenide material may be deposited in narrow trenches which may result in a fin that has indium rich
(Continued)

surfaces and a gallium rich central portion. These indium rich surfaces will abut a gate oxide of a transistor and may result in high electron mobility and an improved switching speed relative to conventional homogeneous composition indium gallium arsenide active channels.

19 Claims, 14 Drawing Sheets

(51) Int. Cl.
H01L 29/66 (2006.01)
H01L 29/423 (2006.01)
H01L 29/786 (2006.01)
H01L 21/762 (2006.01)
H01L 29/04 (2006.01)

(52) U.S. Cl.
CPC .. *H01L 29/42392* (2013.01); *H01L 29/66795* (2013.01); *H01L 29/785* (2013.01); *H01L 29/78696* (2013.01); H01L 29/66545 (2013.01)

(56) References Cited

U.S. PATENT DOCUMENTS

| | | | |
|---|---|---|---|
| 8,691,640 B1 | 4/2014 | Licausi | |
| 9,214,555 B2 | 12/2015 | Oxland et al. | |
| 9,252,275 B2 | 2/2016 | Rachmady et al. | |
| 2002/0014860 A1 | 2/2002 | Rachwal | |
| 2006/0084247 A1 | 4/2006 | Liu | |
| 2007/0029640 A1 | 2/2007 | Isono | |
| 2009/0321717 A1 | 12/2009 | Pillarisetty et al. | |
| 2010/0301390 A1* | 12/2010 | Ko | H01L 29/7851 257/190 |
| 2011/0147711 A1 | 6/2011 | Pillarisetty | |
| 2012/0168913 A1 | 7/2012 | Toh et al. | |
| 2013/0034943 A1 | 2/2013 | Lochtefeld | |
| 2013/0105860 A1 | 5/2013 | Lochtefeld | |
| 2013/0126972 A1 | 5/2013 | Wang | |
| 2013/0126981 A1 | 5/2013 | Ho et al. | |
| 2013/0154016 A1 | 6/2013 | Glass | |
| 2013/0234147 A1* | 9/2013 | Wu | H01L 29/66795 257/76 |
| 2013/0270607 A1 | 10/2013 | Doornbos et al. | |
| 2014/0001572 A1 | 1/2014 | Bohr et al. | |
| 2014/0151814 A1 | 6/2014 | Giles et al. | |
| 2014/0166981 A1* | 6/2014 | Doyle | H01L 29/66666 257/24 |
| 2014/0213031 A1 | 7/2014 | Lin | |
| 2014/0227846 A1 | 8/2014 | Liaw | |
| 2014/0264438 A1 | 9/2014 | Holland et al. | |
| 2015/0001588 A1 | 1/2015 | Gunji et al. | |
| 2016/0204037 A1 | 7/2016 | Goel et al. | |

FOREIGN PATENT DOCUMENTS

| | | |
|---|---|---|
| JP | 2006270107 | 10/2006 |
| JP | 2008527723 | 7/2008 |
| JP | 2008546181 | 12/2008 |
| JP | 2009170511 | 7/2009 |
| JP | 2010278435 | 12/2010 |
| JP | 2011527103 | 10/2011 |
| JP | 2013513250 | 4/2013 |
| TW | 201347046 | 11/2013 |
| TW | 201436213 | 9/2014 |
| WO | 2006125040 | 11/2006 |
| WO | 2014133293 | 9/2014 |
| WO | 2013121926 | 5/2015 |

OTHER PUBLICATIONS

International Search Report and Written Opinion received for PCT Patent Application No. PCT/US2014/056526, dated Jun. 19, 2015, 12 pages.
International Preliminary Report and Written Opinion received for PCT Patent Application No. PCT/US2014/056528, dated Mar. 30, 2017.
International Search Report and Written Opinion received for PCT Patent Application No. PCT/US2014/056528, dated Jun. 19, 2015.
International Search Report and Written Opinion received for PCT Patent Application No. PCT/US2014/056564, dated Jun. 19, 2015.
International Search Report on Patentability and Written Opinion Received for PCT Patent Application No. PCT/US2014/056564, dated Mar. 30, 2017.
Non-Final Office Action for U.S. Appl. No. 15/503,989, dated Nov. 8, 2017.
Non-Final Office Action from U.S. Appl. No. 15/504,171 dated Nov. 3, 2017, 11 pgs.
Restrictions Requirement for U.S. Appl. No. 15/503,989, dated Aug. 16, 2017.
Extended European Search Report for European Patent Application No. 14901828.5, dated Apr. 6, 2018.
Extended European Search report for European Patent Application No. 14901896.2, dated Apr. 17, 2018.
Final Office Action for U.S. Appl. No. 15/503,989, dated May 7, 2018.
Final Office Action from U.S. Appl. No. 15/504,171, notified May 3, 2018.
Partial European Search Report from European Patent Application No. 14901856.6 notified Apr. 6, 2018.
Advisory Action for U.S. Appl. No. 15/503,989, dated Jul. 16, 2018.
Extended European Search Report from European Patent Application No. 14901856.6 notified Jul. 16, 2018, 11 pgs.
Non-Final Office Action from Japanese Patent Application No. 2017-507850 notified Jun. 26, 2018, 9 pgs.
Non-Final Office Action from U.S. Appl. No. 15/504,171 notified Aug. 30, 2018, 12 pgs.
Notice of Reasons for Rejection for Japan Patent Application No. 2017504754, dated Jun. 18, 2018.
Office Action dated Nov. 16, 2018 for TW Patent Application No. 104126394.

* cited by examiner

APPARATUS AND METHODS TO CREATE AN INDIUM GALLIUM ARSENIDE ACTIVE CHANNEL HAVING INDIUM RICH SURFACES

RELATED APPLICATION

The present application is a national stage entry of PCT Patent Application No. PCT/US2014/056526, filed on Sep. 19, 2014, entitled "APPARATUS AND METHODS TO CREATE AN INDIUM GALLIUM ARSENIDE ACTIVE CHANNEL HAVING INDIUM RICH SURFACES", which is hereby incorporated herein by reference in its entirety and for all purposes.

TECHNICAL FIELD

Embodiments of the present description generally relate to the field of microelectronic devices, and, more particularly, to forming an active channel in a microelectronic transistor having indium rich surfaces to increase carrier mobility.

BACKGROUND

Higher performance, lower cost, increased miniaturization of integrated circuit components, and greater packaging density of integrated circuits are ongoing goals of the microelectronic industry for the fabrication of microelectronic devices. To achieve these goals, transistors within the microelectronic devices must scale down, i.e. become smaller. Along with the reduction in the size of transistors, there has also been a drive to improve their efficiency with improvement in their designs, materials used, and/or in their fabrication processes. Such design improvements include the development of unique structures, such as non-planar transistors, including tri-gate transistors, FinFETs, TFETS, omega-FETs, and double-gate transistors.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
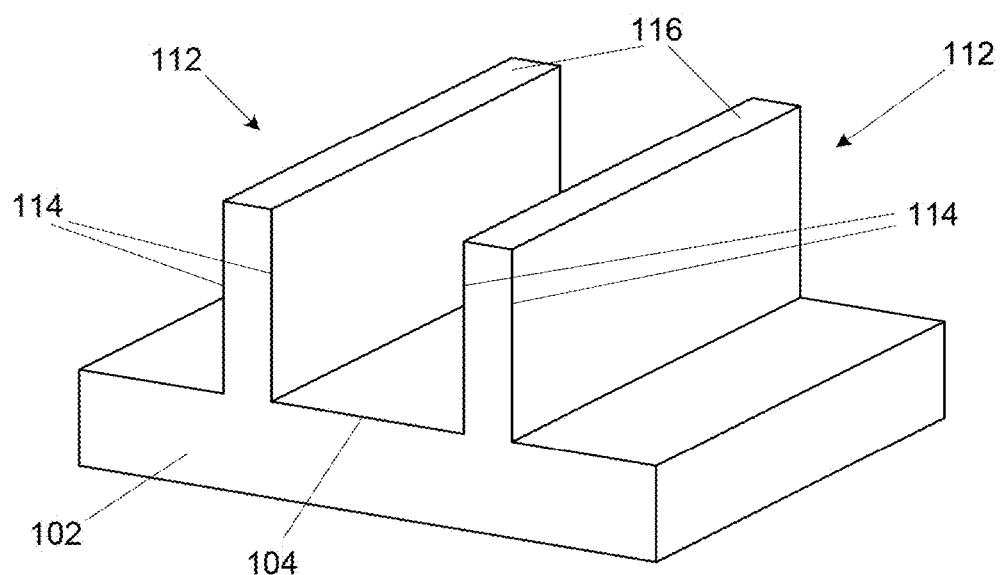
FIGS. 1-11 are oblique sectional views, side cross-section views, and graphical illustrations of the fabrication of an indium gallium arsenide active channel having indium rich surfaces for a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

As known to those skilled in the art, III-V group materials can have higher electron mobility relative to conventional silicon materials commonly used in microelectronic transistor fabrication and therefore have potential for use in high performance transistors in integrated circuit manufacture. Embodiments of the present description related to indium gallium arsenide active channels, and processes for the fabrication of the same, that enables improved carrier mobility when fabricating fin shaped active channels, such as those used in tri-gate or gate all around (GAA) devices. In one embodiment, an indium gallium arsenide material may be deposited in narrow trenches which may result in a fin that has indium rich surfaces and a gallium rich central portion. These indium rich surfaces will abut a gate oxide of a transistor and will result in high electron mobility and an improved switching speed relative to conventional homogeneous composition indium gallium arsenide active channels. In other embodiments, sub-structures may be formed to abate off state leakage.

As shown in FIG. 1, at least one fin 112 may be formed on a substrate 102, wherein the fins 112 may include opposing sidewalls 114 extending from a first surface 104 of the substrate 102 and which terminate in an upper surface 116. For the clarity and brevity, only two fins 112 are illustrated in FIG. 1; however, it is understood that any appropriate number of fins 112 could be fabricated. In one embodiment, an etch mask (not shown) may be patterned on the substrate 102 followed by the etching of the substrate 102, wherein the portions of the substrate 102 protected by etch mask (not shown) become the fins 112, and the etch mask (not shown) may be thereafter removed, as will be understood to those skilled in the art. In an embodiment of the present disclosure, the substrate 102 and the fins 112 may be any appropriate material, including, but not limited to, a silicon-containing material, such as monocrystalline silicon. The substrate 102 and the fins 112, however, need not necessarily be fabricated from silicon-containing materials, and can be other types of materials known in the art. In a further embodiment, the substrate 102 may comprise a silicon-on-insulator (SOI) substrate, a silicon-on-nothing (SON), a germanium substrate, a germanium-on-insulator (GeOI) substrate, or a germanium-on-nothing (GeON).

Figure 2:
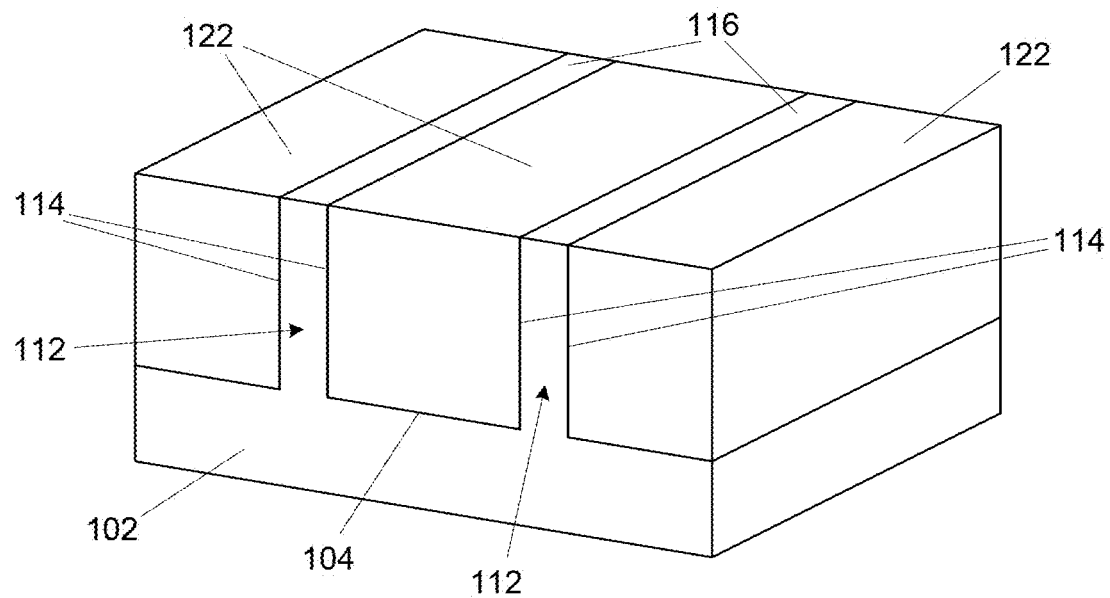

As shown in FIG. 2, a dielectric material may be deposited, by any appropriate deposition process, over the substrate 102 and the fins 112, and the dielectric material may be planarized to exposed the fin upper surface 116, thereby forming isolation structures 122, known as shallow trench isolation structures, abutting the opposing fin sidewalls 114. The isolation structures 122 may be formed from any appropriate dielectric material, including but not limited to, silicon oxide ($SiO_2$).

Figure 3:
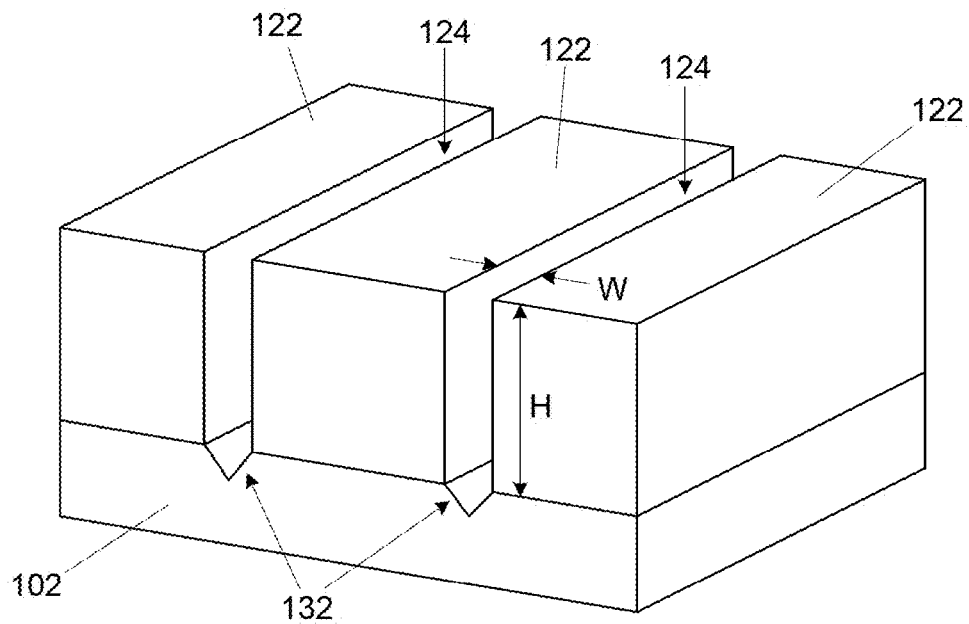

As shown in FIG. 3, the fins 112 may be removed, thereby forming a trench 124. The fins 112 may be removed by any known etching techniques, including, but not limited to, dry etching, wet etching, or combinations thereof. In one embodiment, a portion of the each trench 124 may be formed to extend into the substrate 102 either during the removal of the fins 112 or thereafter. This portion of the trench 124 will hereinafter be referred to as a nucleation trench 132. In one embodiment, the nucleation trench 132 may have a (111) faceting, which may facilitate the growth of a III-V material, as will be discussed. It is understood that alternate geometries of the nucleation trench 132 may be utilized.

Figure 4:
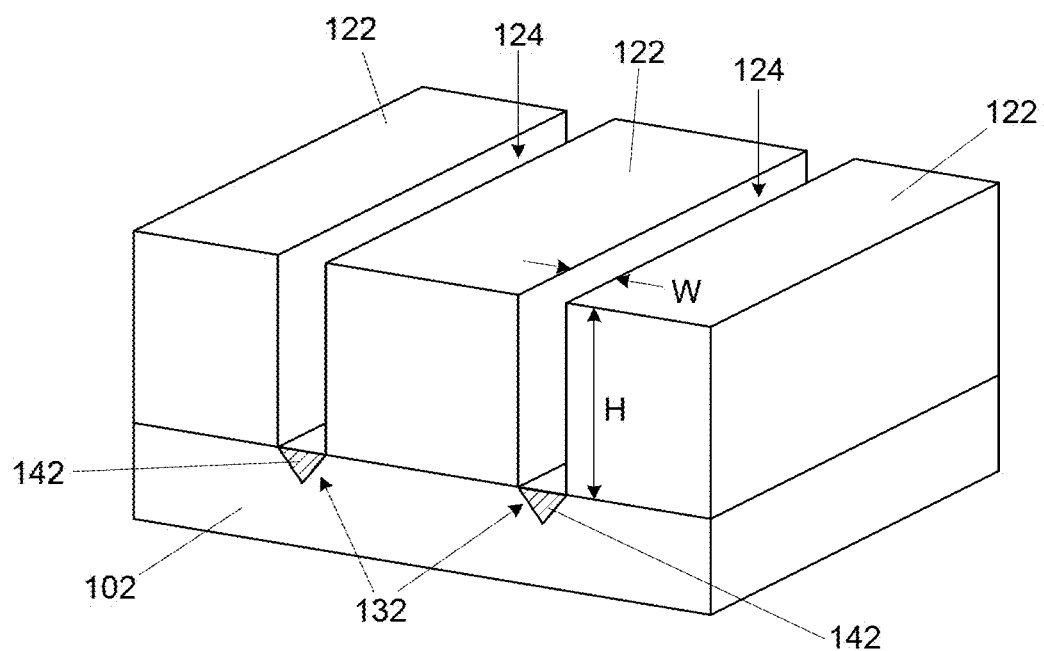

As shown in FIG. 4, a nucleation layer 142 may be formed in the nucleation trench 132. The nucleation layer 142 may be formed by any formation process and may be any appropriate material, such as a III-V epitaxial material, including but not limited to, indium phosphide, gallium phosphide, gallium arsenide, and like. The nucleation layer 142 may be doped or undoped, and may be formed by epitaxial deposition.

Figure 5:
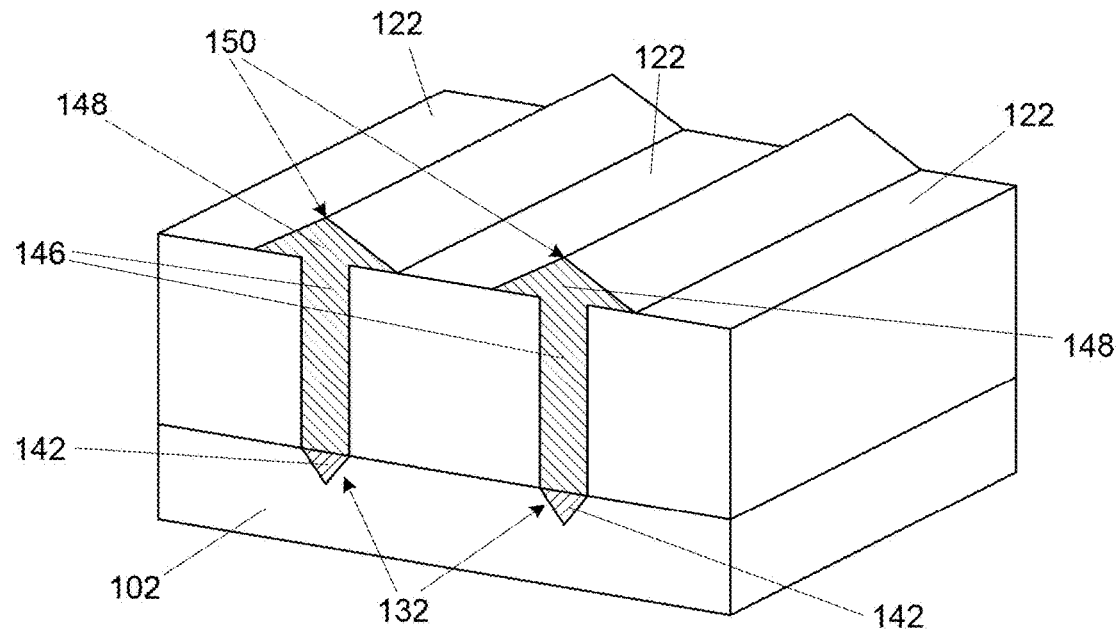

As shown in FIG. 5, an indium gallium arsenide active channel 146 may be formed or grown on the nucleation layer 142. In some embodiments, a chemical vapor deposition (CVD) process or other suitable deposition technique may be used for the depositing or otherwise forming the active channel 146. For example, the deposition may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools using indium, gallium, and arsenic, and/or precursors thereof. In one specific such example embodiment, the active channel 146 may be undoped indium gallium arsenide, and the nucleation layer 142 and the doped substructure 144 may be indium phosphide. In any such embodiments, there may be a precursor bubbler with a carrier gas such as, for instance, hydrogen, nitrogen, or a noble gas (e.g., precursor may be diluted at about 0.1-20% concentration with the balance being carrier gas). In some example cases, there may be indium precursor such as trimethylindium, a gallium precursor such as trimethylgallium, and/or an arsenic precursor such as arsine or tertiary butyl arsine. There may also be an etchant gas such as, for example, halogen-based gas such as hydrogen chloride (HCl), chlorine (Cl), or, hydrogen bromide (HBr). The basic deposition of the indium gallium arsenide active channel 146 may be possible over a wide range of conditions using a deposition temperature in the range, for example, from between about 300° C. and 650° C., or in a more specific example, from between about 400 and 600° C.) and a reactor pressure, for instance, in the range of about 1 Torr to 760 Torr. Each of the carrier and etchants can have a flow in the range of between about 10 and 300 SCCM (typically, no more than 100 SCCM of flow is required, but some embodiments may benefit from higher flow rates). In one specific example embodiment, the deposition of the active channel 146 may be carried out at a flow rate that ranges between about 100 and 1000 SCCM.

The formation of the indium gallium arsenide active channel 146 may occur in a relatively narrow trench 124. In one embodiment, the narrow trench 124 may have a height H (see FIG. 3) in the range of about 50 to 500 nm and a width W (see FIG. 3) of less than about 25 nm (preferably less than about 10 nm).

Figure 6:
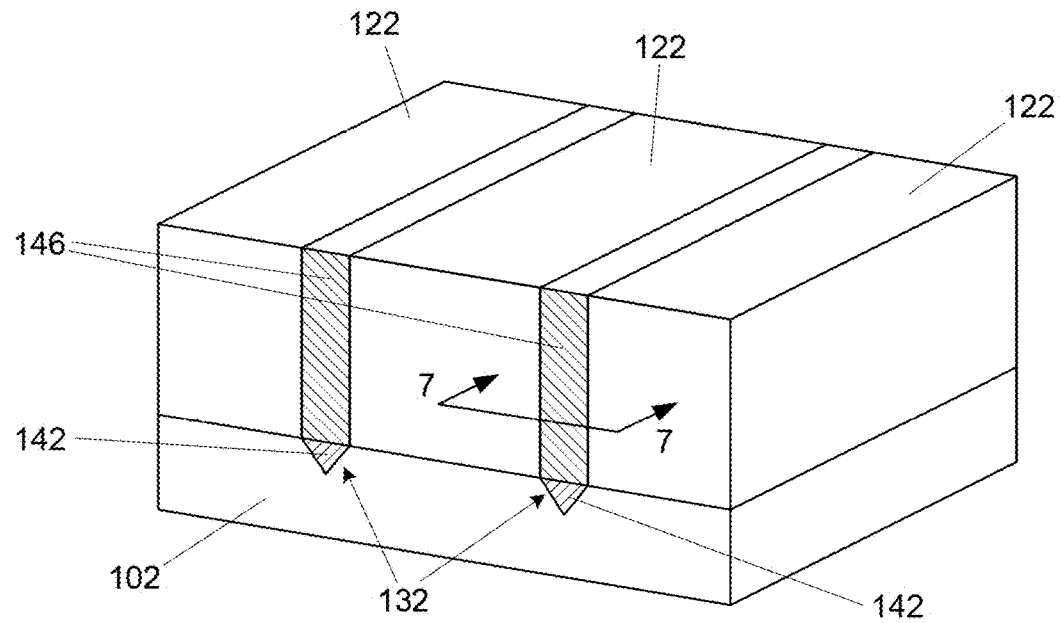

As still further shown in FIG. 5, a portion 148 of indium gallium arsenide active channel 146 may extend out of the trench 124 (see FIG. 3), particularly when epitaxial growth processes are utilized. Thus, as shown in FIG. 6, the portion 148 of the indium gallium arsenide active channel 146 may be removed, such as by chemical mechanical planarization.

Figure 7:
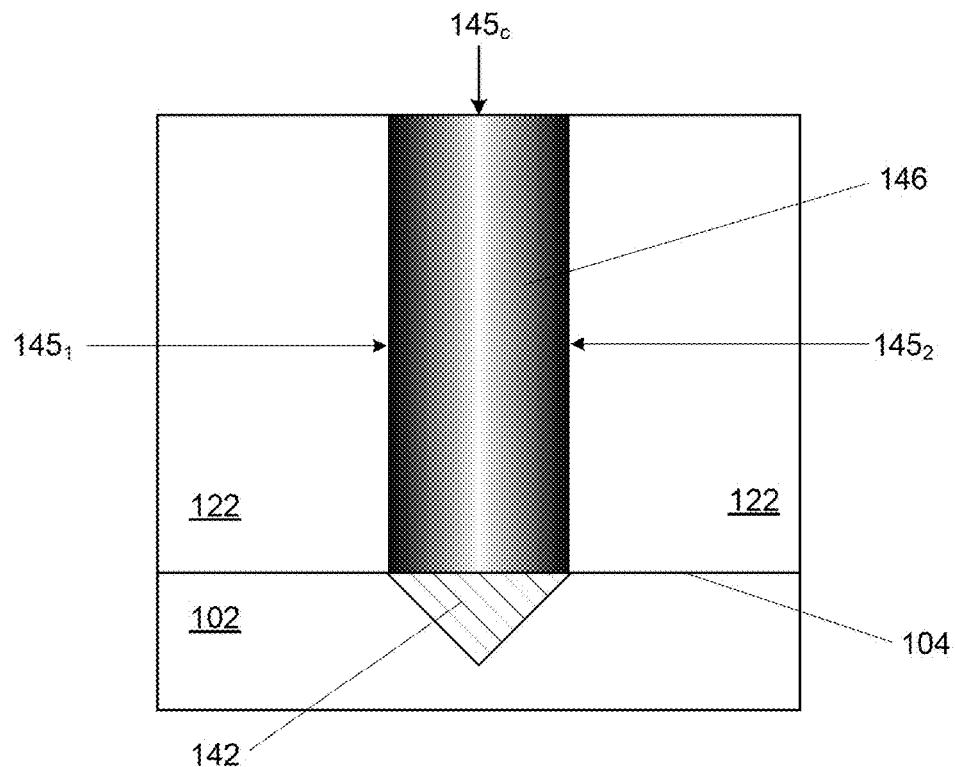
Figure 8:
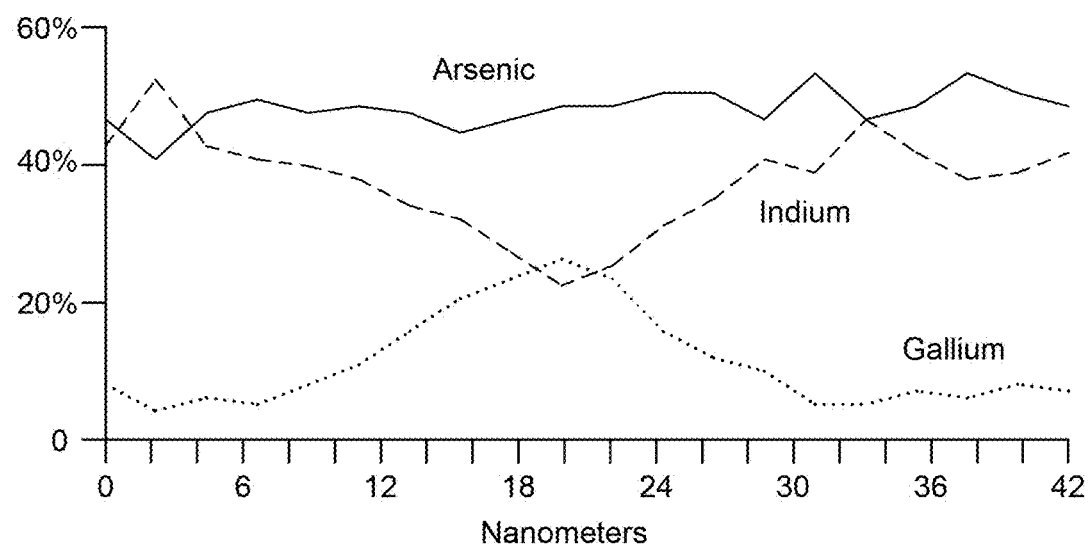

As shown in FIG. 7, the process of the present description results in the indium rich material forming on opposing sidewall surfaces of the indium gallium arsenide active channel 146 adjacent the isolation structures 122, thereby forming indium rich surfaces $145_1$ and $145_2$. In one embodiment, the indium rich surfaces $145_1$ and $145_2$ are substantially perpendicular to the substrate first surface 104. The distribution of the indium is illustrated in FIG. 7 with the higher indium concentration having darker shading. This indium distribution is graphically illustrated in FIG. 8 with the x-axis being the distance from one indium rich surface $145_1$ to the opposing indium rich surface $145_2$ of the indium gallium arsenide active channel 146, and the y-axis being concentration in percentage of the indium (dashed line), the gallium (dotted line), and the arsenic (solid line) across the x-axis distance (in nanometers). As it can be seen in FIGS. 7 and 8, the term "indium rich" is an indium content that is higher than an average amount of indium in the indium gallium arsenide active channel 146. A center region $145_c$, approximately at a midline between one indium rich surface $145_1$ and the opposing indium rich surface $145_2$, may be "gallium rich" relative to the average amount of gallium in the indium gallium arsenide active channel 146.

With the deposition conditions discussed above, the indium gallium arsenide active channel 146 may be grown in the narrow trench 124 (see FIG. 3), such that the growth surface facets in a self-assembled fashion into a long "hut-shape" with {111} plane top surfaces or "elongated hut-like growth" (see cross-section in FIG. 5). The described process conditions are conducive to creating this faceted growth that permits sufficient adatom migration thereby achieving this low energy-state surface shape, as will be understood to those skilled in the art. It has been found that the energetics of incorporating gallium are different from those of incorporating indium in terms of a natural tendency for gallium to preferentially incorporate at the apex 150 (see FIG. 5), e.g. along center region 145$_c$ (see FIG. 7), while indium will incorporate preferentially at the edges, e.g. indium rich surfaces 145$_1$ and 145$_2$, of the indium gallium arsenide active channel 146. In specific, the temperature and precursor flows may be tuned to maximize the sharpness of the hut-roof structure, i.e., the portion 148 (see FIG. 5) of indium gallium arsenide active channel 146 that extends out of the trench 124 (see FIG. 3) and hence achieves the concentration profile shown in FIGS. 7 and 8. For weakly faceted growth conditions, such as obtained with higher temperature, e.g. about 580° C., and high metal species precursor fluxes, the effect may be limited to wide trenches, such as about 30 nm. By decreasing the process temperature to 520° C., for example, and/or the metal species precursor fluxes, the faceting can be improved and the effect can extend to narrower trenches of 15 nm, for example. It is believed that the effect can be driven to sub-10 nm trenches as well.

Figure 9:
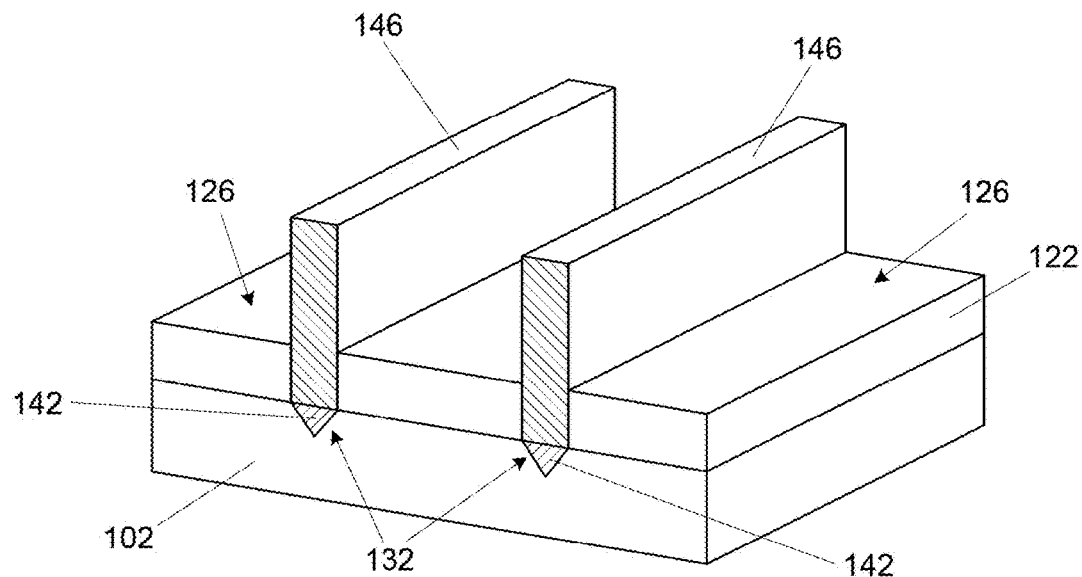

As shown in FIG. 9, the isolation structures 122 may be recessed, such as by an etching process, such that at least a portion of the indium gallium arsenide active channel 146 extends above an upper plane 126 of the isolation structures 122.

Figure 10:
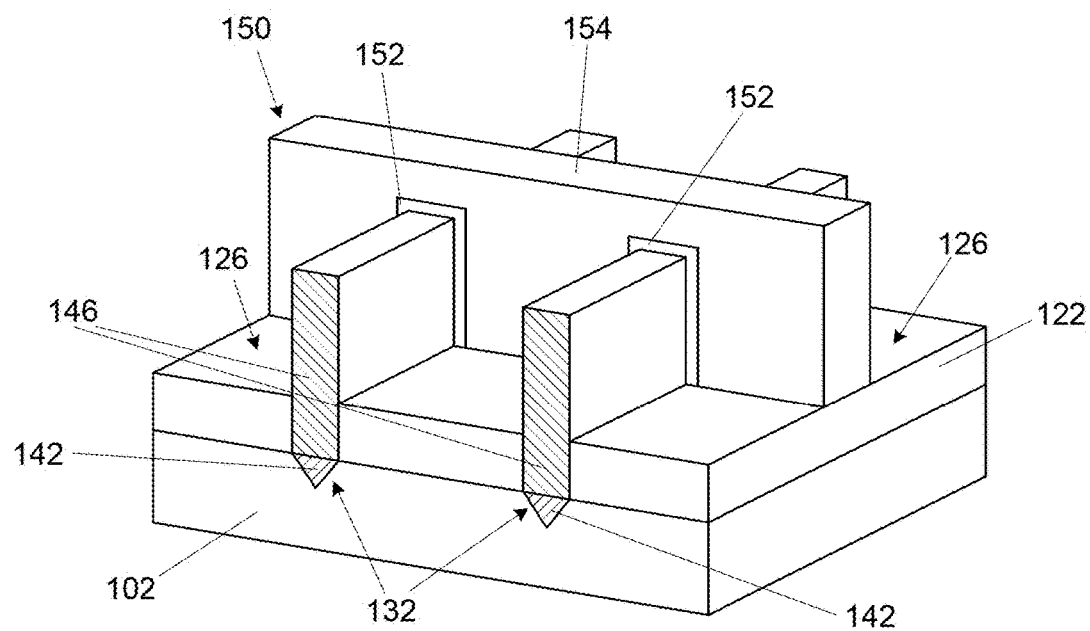

As shown in FIG. 10, at least one gate 150 may be form over the portion of the indium gallium arsenide active channel 146 extending above the isolation structures 122. The gate 150 may be fabricated by forming a gate dielectric layer 152 on or adjacent to the fin upper surface 116 and on or adjacent to the pair of laterally opposing fin sidewalls 114, and forming a gate electrode 154 on or adjacent the gate dielectric layer 152, either by a gate first or a gate last process flow, as will be understood to those skilled in the art.

The gate dielectric layer 152 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 152 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The gate electrode 154 can be formed of any suitable gate electrode material. In an embodiment of the present disclosure, the gate electrode 154 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 154 can be formed by well-known techniques, such as by blanket depositing a gate electrode material and then patterning the gate electrode material with well-known photolithography and etching techniques, as will be understood to those skilled in the art.

As will be understood to those skilled in the art, in the operation of a microelectronic transistor, carriers travel in a surface region of the active channel closest to the gate oxide. Further, it is understood to those skilled in the art, indium gallium arsenide active channels which are indium rich have a lower band-gap and higher mobility relative to indium gallium arsenide active channels which are gallium rich. Thus, having indium rich surfaces 145$_1$ and 145$_2$ (see FIG. 7) which abut the gate oxide 152 (see FIG. 10) will result in high electron mobility and the electrostatics in terms of the ability to turn a transistor on and off will be better, i.e., faster switching and less off state leakage. Having an indium gallium arsenide active channel 146 with indium rich surfaces 145$_1$ and 145$_2$ may be advantageous over an indium gallium arsenide active channel which has a homogeneously high indium content, as indium concentration has a strong expanding effect on lattice constant. Thus, when indium is increased beyond a critical limit, the density of misfit dislocations and other planar and point defects increases. As will be understood, these defects are not compatible with transistor requirements in terms of carrier mobility or trapped and mobile charges. Thus, the embodiments of the present description, by having indium content graded with the indium rich areas localized at the surfaces 145$_1$, 145$_2$ will result in lower defect densities than an equivalent homogeneous concentration profile device.

Figure 11:
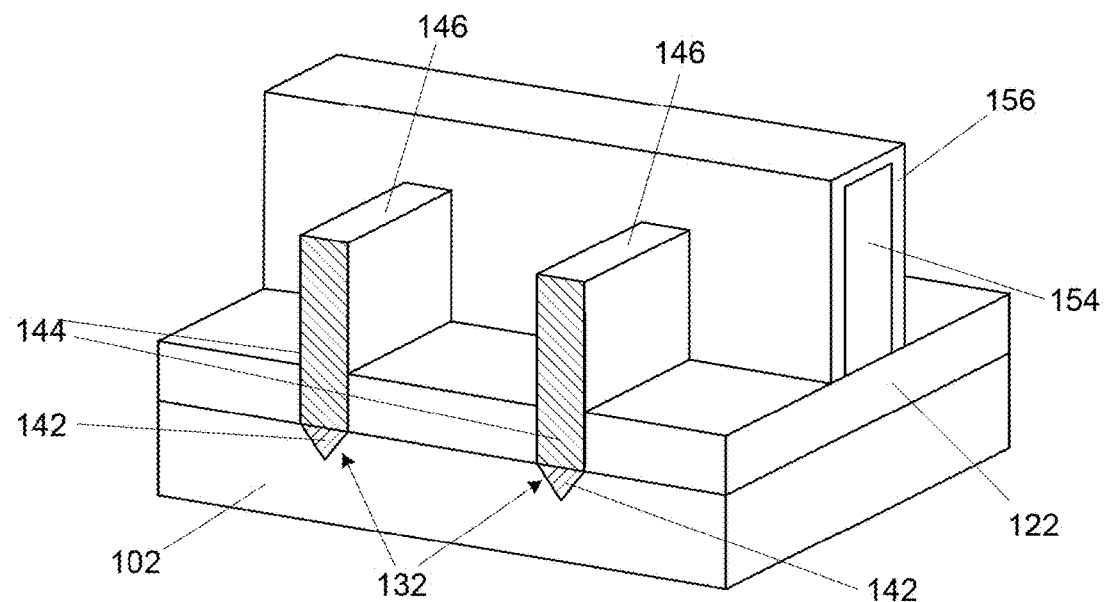

As shown in FIG. 11, a gate spacer 156 may be deposited and patterned on the gate electrode 154 with well-known deposition and etching techniques. The gate spacer 156 may be formed from any appropriate dielectric material, including, but not limited to, silicon oxide, silicon nitride, and the like.

It is understood that a source region and a drain region (not shown) may be formed in the indium gallium arsenide active channel 146 on opposite sides of the gate 150 or a portions of the indium gallium arsenide active channel 146 may be removed on opposite sides of the gate 150 and the source region and the drain region formed in place thereof. The source and drain regions may be formed of the same conductivity type, such as p-type conductivity. In some implementations of an embodiment of the present disclosure, the source and drain regions may have the substantially the same doping concentration and profile while in other implementations they may vary. It is understood that only n-MOS are shown, p-MOS regions would be patterned and processed separately.

In other embodiments of the present description, a sub-structure, e.g. a buffer, may be formed between the indium gallium arsenide active channel and the substrate. The sub-structure may be fabricated such that source to drain leakage through structures below the active channel. In one embodiment the sub-structure may comprise a high band-gap III-V material, which may have a desired conduction band offset, such that leakage may be arrested without having a significant impact on electronic mobility within the active channel. In still other embodiments, the sub-structure may comprise either a low band-gap III-V material or a high band-gap material III-V material, which is doped with a p-type dopant. For the purpose of the present description, a low band-gap material may be defined to be a material that has a band-gap less than silicon and a high band-gap material may be defined to be a material that has a band-gap greater than silicon.

Figure 12:
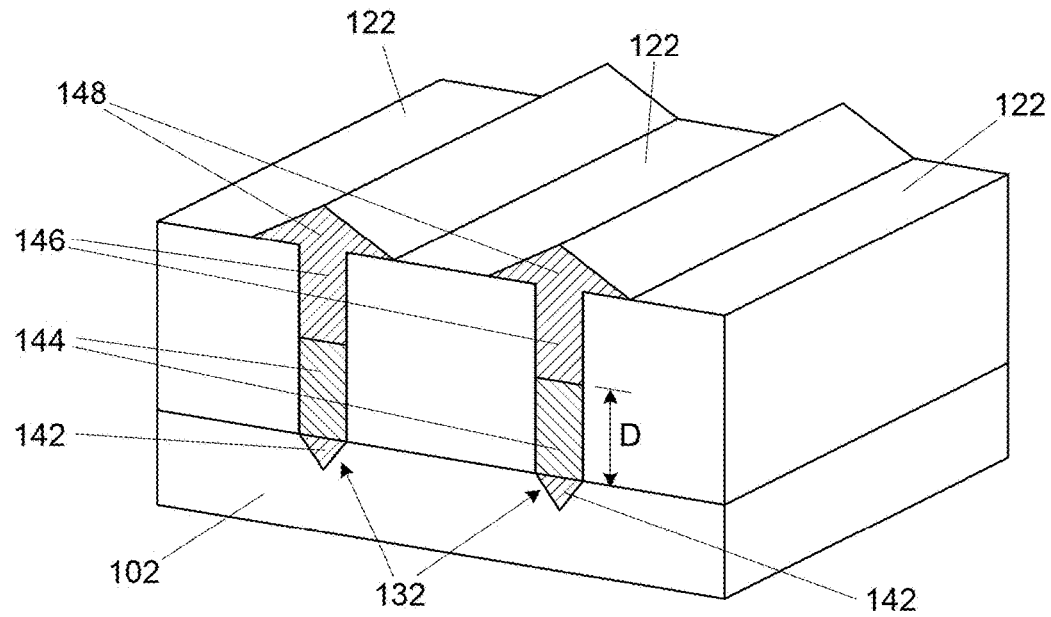
FIGS. 12-18 are oblique sectional views, side cross-section views, and graphical illustrations of the fabrication of an indium gallium arsenide active channel with a sub-structure for a non-planar transistor, according to another embodiment of the present description.

Beginning with FIG. 4, as shown in FIG. 12, a sub-structure 144 may be formed on the nucleation layer 142 within the trench 124 (see FIG. 3). The sub-structure 144 may be formed by any known formation process. In one embodiment of the present description, the sub-structure may be a high band-gap III-V material, including, but not limited to, indium aluminum arsenide, indium phosphide, gallium phosphide, gallium arsenide, gallium arsenide antimonide, aluminium arsenide antimonide, indium aluminum gallium arsenide, indium aluminum gallium phosphide, aluminum gallium arsenide, and the like.

The high band-gap material utilized for the sub-structure 144 may be selected to have the desired conduction band offset with the indium gallium arsenide active channel 146 which will be effective in excluding electrons from the sub-structure 144, thereby reducing leakage. Furthermore, as the formation of the nucleation layer 142, the sub-structure 144, and the active channel 146 occurs in a relatively narrow trench 124. In one embodiment, the narrow trench 124 may have a height H (see FIG. 3) in the range of about 50 to 500 nm and a width W (see FIG. 3) of less than about 50 nm (preferably less than 30 nm). Lattice mismatch between the substrate 102 and the nucleation layer 142/sub-structure 144 can be larger than that which allows for substantially defect free formation, as the nucleation layer 142/sub-structure 144 may be formed to have a sufficient depth D to trap defects, such as stacking faults, dislocations, and the like, away from the indium gallium arsenide active channel 146, as will be understood to those skilled in the art. Thus, electron mobility in the active channel 146 may not be significantly impaired thereby. While the indium gallium arsenide active channel 146 may not achieve theoretical maximum mobility values, it nevertheless provides a compelling performance advantage relative to silicon based n-MOS transistors. In one embodiment the sub-structure 144 may have a depth D (e.g. the distance between the substrate 102 and the indium gallium arsenide active channel 146) of greater than about 50 nm and a width of less than about 25 nm (i.e. the trench width W). The high band-gap material may be doped or undoped. In doped embodiment, the high band-gap material may be doped with a dopant, such as a p-type dopant, including but not limited to magnesium, zinc, carbon, beryllium, and the like. Such a combination of high band-gap material and dopants may be more effective than a dopant alone for reducing leakage, so long as fabrication process result in an acceptably low crystalline concentration, as will be understood to those skilled in the art.

In another embodiment of the present description, the sub-structure 144 may be made from a low band-gap material, including, but not limited to, indium gallium arsenide, gallium arsenide, indium phosphide, and the like, which is doped with a dopant, such as a p-type dopant, including, but not limited to, magnesium, zinc, carbon, beryllium, and the like. In one embodiment of the present description, the dopant concentration may be between about 1E17-1E19 atoms/cm$^3$. In one embodiment, the doped sub-structure 144 may be the same material as the nucleation layer 142, such that few or no lattice defects occur. In other embodiments, the nucleation layer 142 may be graded into the sub-structure 144 or the material compositions thereof may be stepped in concentration from one to the other, as will be understood to those skilled in the art.

In some example embodiments, the sub-structure 144 may be epitaxially deposited. The thickness $T_s$ (see FIG. 5) of the doped sub-structure 144 (see FIG. 5) and the thickness $T_a$ of the active channel 146 may be in the range, for example, of 500 to 5000 Å, in accordance with some specific example embodiments, although other embodiments may have other layer thicknesses, as will be apparent in light of this disclosure. In particular trench-fill embodiments will be in this thickness range while blanket deposition and subsequent patterning embodiments can have thickness values up to 100 times higher. In some embodiments, a chemical vapor deposition (CVD) process or other suitable deposition technique may be used for the depositing or otherwise forming the sub-structure 144. For example, the deposition may be carried out by CVD, or rapid thermal CVD (RT-CVD), or low pressure CVD (LP-CVD), or ultra-high vacuum CVD (UHV-CVD), or gas source molecular beam epitaxy (GS-MBE) tools using III-V material compounds, such as combinations of indium, aluminum, arsenic, phosphorus, gallium, antimony, and/or precursors thereof. In one example embodiment, the sub-structure 144 may be gallium arsenide doped with zinc to provide zinc concentrations of up to approximately 1E19 atom/cm$^3$, which may result in a resistivity of about 5E-3 Ohm-cm (or a corresponding conductivity of up to 200 Mho/cm). In any such embodiments, there may be a precursor bubbler with a carrier gas such as, for instance, hydrogen, nitrogen, or a noble gas (e.g., precursor may be diluted at about 0.1-20% concentration with the balance being carrier gas). In some example cases, there may be an arsenic precursor such as arsine or tertiary butyl arsine, a phosphorous precursor such as tertiary butylphosphine, a gallium precursor such as trimethylgallium, and/or an indium precursor such as trimethylindium. There may also be an etchant gas such as, for example, halogen-based gas such as hydrogen chloride (HCl), chlorine (Cl), or, hydrogen bromide (HBr). The basic deposition of the sub-structure 144 may be possible over a wide range of conditions using a deposition temperature in the range, for example, from between about 300° C. and 650° C., or in a more specific example, from between about 400 and 500° C.) and a reactor pressure, for instance, in the range of about 1 Torr to 760 Torr. Each of the carrier and etchants can have a flow in the range of between about 10 and 300 SCCM (typically, no more than 100 SCCM of flow is required, but some embodiments may benefit from higher flow rates). In one specific example embodiment, the deposition of sub-structure 144 may be carried out at a flow rate that ranges between about 100 and 1000 SCCM. For an in-situ doping of zinc, for instance, a bubbler source using di-ethyl zinc (DEZ) may be used (e.g., hydrogen gas bubbled through liquid DEZ and at a flow rate that ranges between about 10 and 100 SCCM).

As further shown in FIG. 12, the indium gallium arsenide active channel 146 may be formed on the sub-structure 144 within the trench 124 (see FIG. 3) in the manner previously discussed with regard to FIG. 4.

The formation of the nucleation layer 142, the sub-structure 144, and the active channel 146 may occur in a relatively narrow trench 124. In one embodiment, the narrow trench 124 may have a height H (see FIG. 3) in the range of about 50 to 500 nm and a width W (see FIG. 3) of less than about 25 nm (preferably less than 10 nm). In one embodiment the doped sub-structure 144 may have a depth D (e.g. the distance between the substrate 102 and the active channel 146) of greater than about 50 nm and a width of less than about 25 nm (i.e. the trench width W).

When a doped sub-structure 144 is formed, the fabrication processes, which are subsequent to the formation of the indium gallium arsenide active channel 146, should be conducted at relatively low temperatures (e.g. low thermal budget) to prevent the dopant atoms from the doped sub-structure 144 from diffusing into the active channel 146 and impact the electron mobility thereof. However, a lighter diffusion (lower than about 1E17 atoms/cm$^3$) of the p-type dopants from the doped sub-structure 144 into the active channel 146 may not be an issue, as the deposited condition thereof may be lightly n-type, and thus may require light p-type counter doping to compensate, as will be understood to those skilled in the art.

Figure 13:
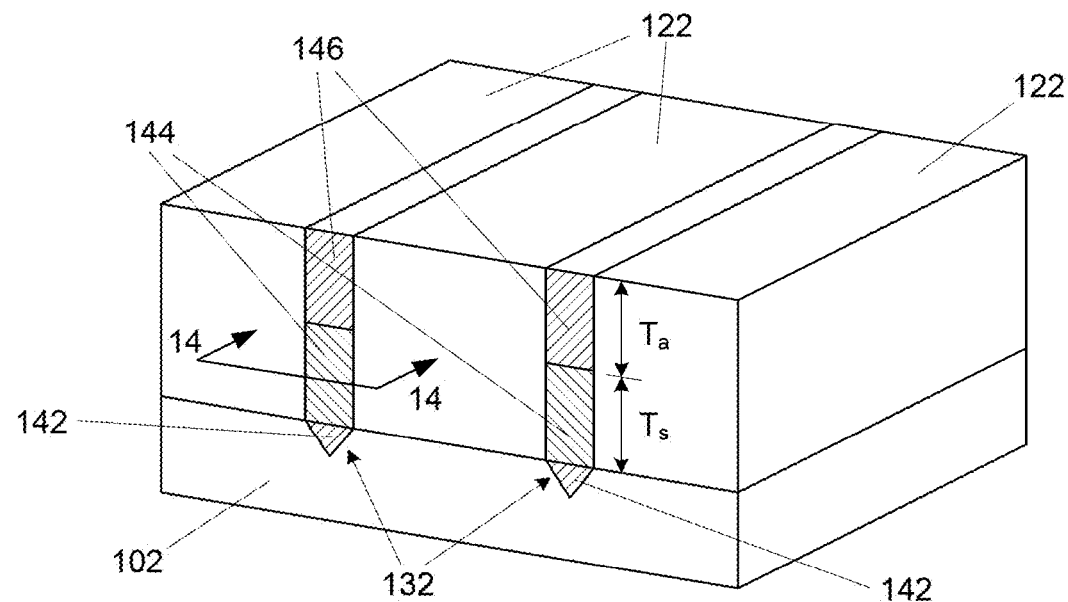

As still further shown in FIG. 12, a portion 148 of indium gallium arsenide active channel 146 may extend out of the trench (see FIG. 3), particularly when epitaxial growth processes are utilized. Thus, as shown in FIG. 13, the portion 148 of the indium gallium arsenide active channel 146 may be removed, such as by chemical mechanical planarization.

Figure 14:
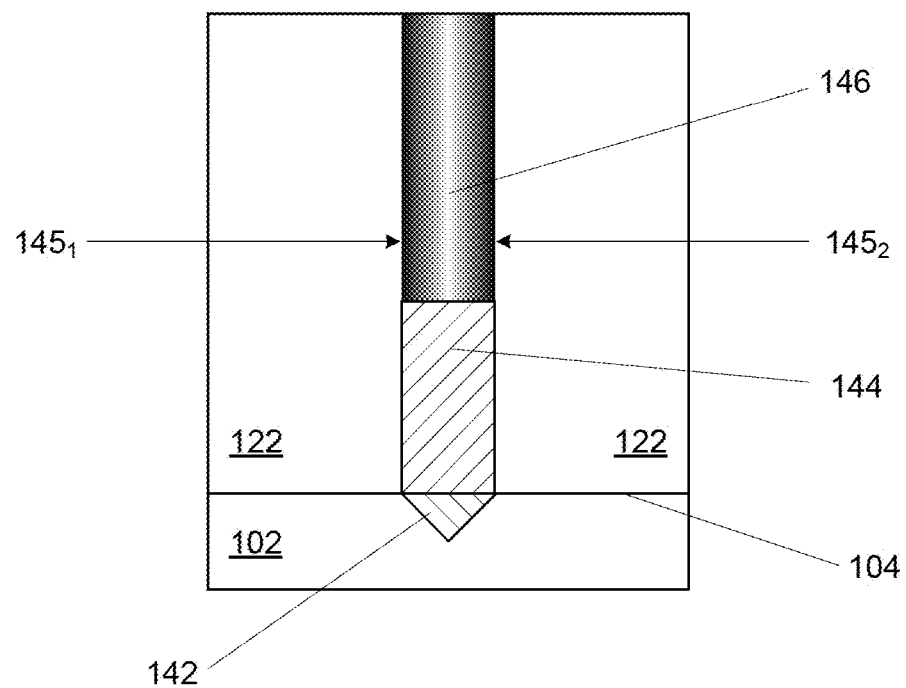
Figure 15:
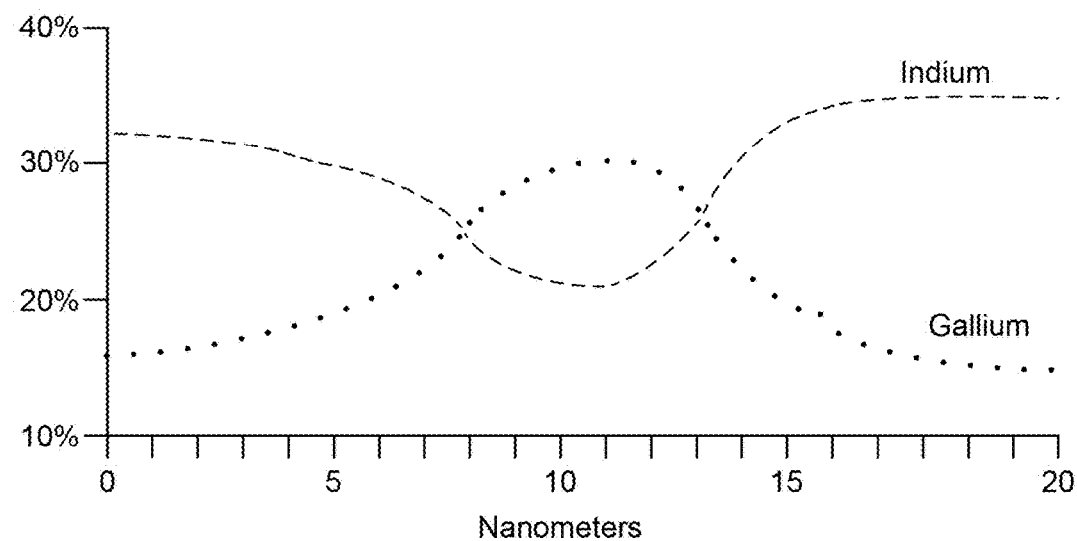

As shown in FIG. 14, the process of the present description results in the indium migrating toward opposing sidewall surfaces of the indium gallium arsenide active channel 146 adjacent the isolation structures 122, thereby forming indium rich surfaces $145_1$ and $145_2$. In one embodiment, the indium rich surfaces $145_1$ and $145_2$ are substantially perpendicular to the substrate first surface 104. The distribution of the indium is illustrated in FIG. 14 with the indium having darker shading. This indium distribution is graphically illustrated in FIG. 15 with the x-axis being the distance from one indium rich surface $145_1$ to the opposing indium rich surface $145_2$ of the indium gallium arsenide active channel 146, and the y-axis being concentration in percentage of the indium (dashed line) and the gallium (dotted line) across the x-axis distance (in nanometers). A line for arsenic is not shown of clarity and conciseness, as it is about 50% at every point across the device. As it can be seen in FIGS. 14 and 15, the term "indium rich" is an indium content that is higher than an average amount of indium in the indium gallium arsenide active channel 146. A center region $145_c$, approximately at a midline between one indium rich surface $145_1$ and the opposing indium rich surface $145_2$, may be "gallium rich" relative to the average amount of gallium in the indium gallium arsenide active channel 146.

Figure 16:
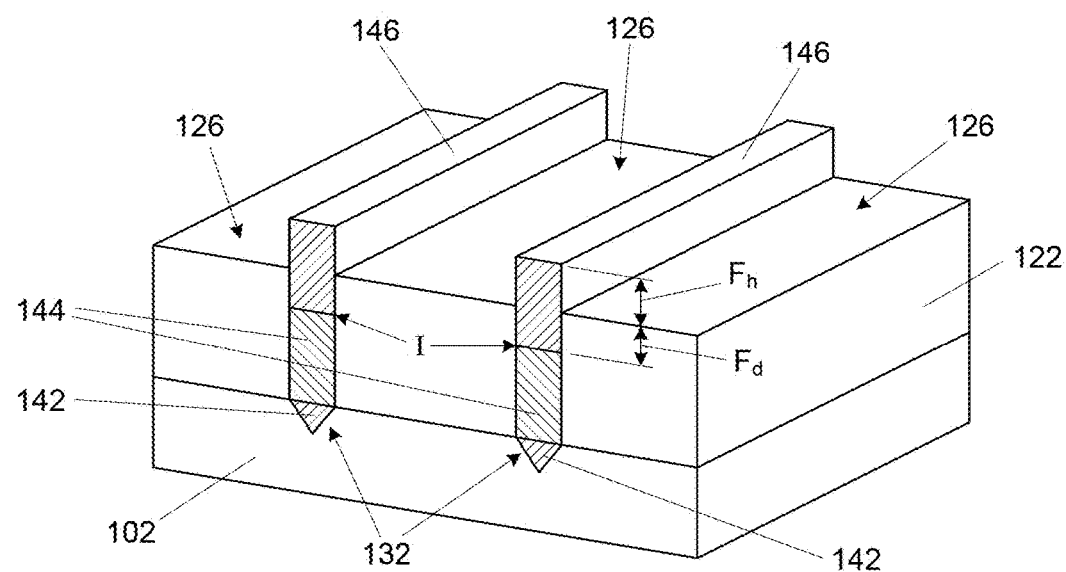

As shown in FIG. 16, the isolation structures 122 may be recessed, such as by an etching process, such that at least a portion of the indium gallium arsenide active channel 146 extends above an upper plane 126 of the isolation structures 122. In one embodiment, the height $F_h$ of the indium gallium arsenide active channel 146 extending about the isolation structure upper plane 126 may be about 45 nm. An intersection I between the indium gallium arsenide active channel 146 and the sub-structure 144 may occur at a depth $F_d$ relative to the isolation structure upper plane 126. In an embodiment, the intersection I may be slightly above or slightly below the isolation structure upper plane 126, such as about 10 nm above or below.

Figure 17:
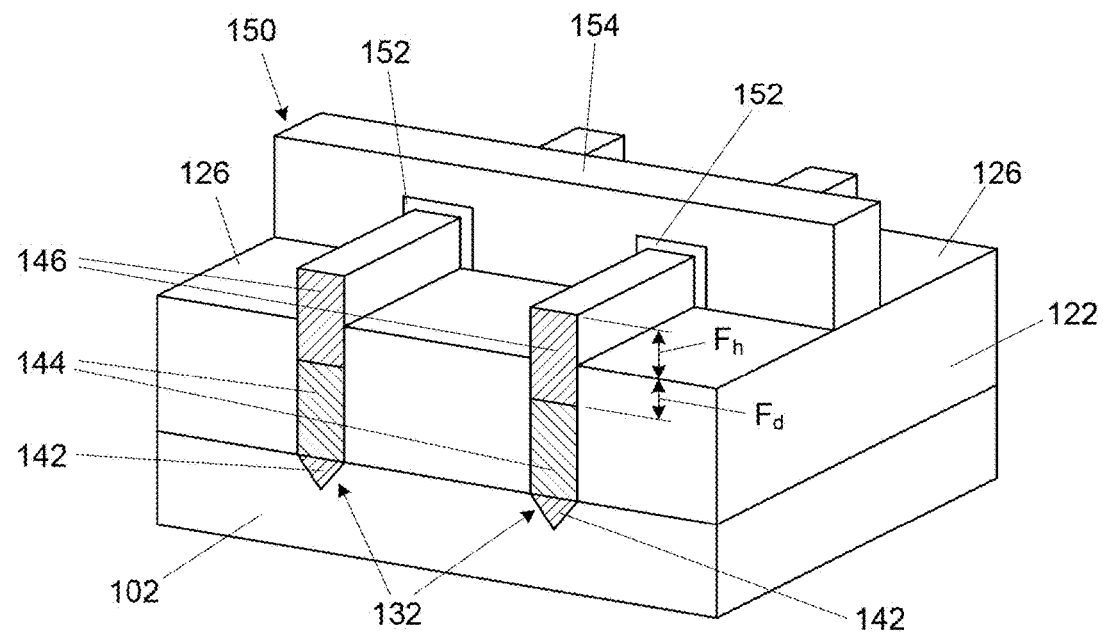
Figure 18:
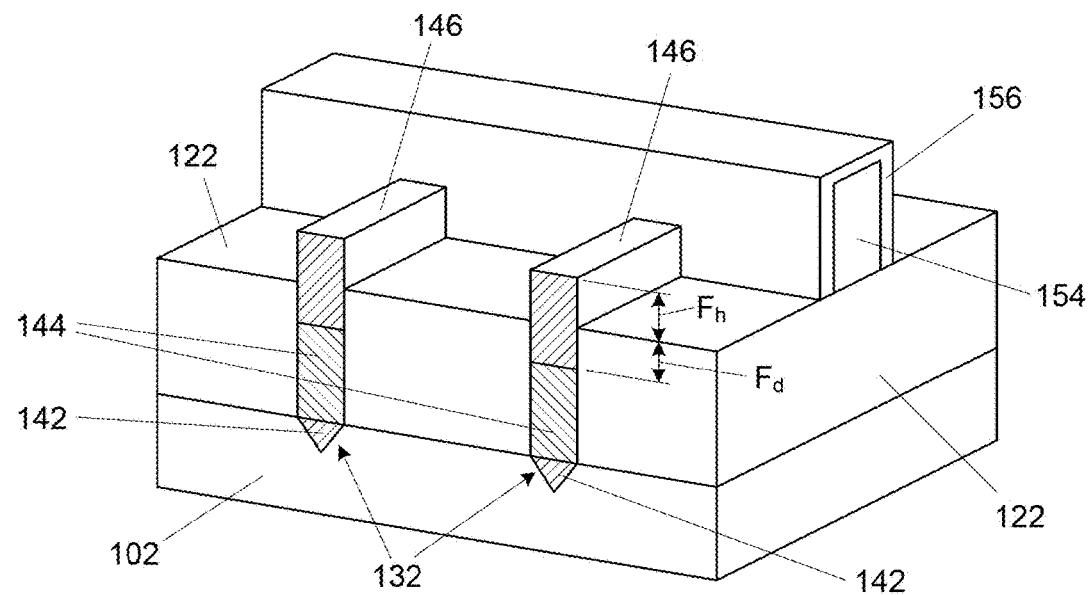

As shown in FIG. 17, at least one gate 150 may be form over the portion of the indium gallium arsenide active channel 146 extending above the isolation structures 122. The gate 150 may be fabricated by forming a gate dielectric layer 152 on or adjacent to the fin upper surface 116 and on or adjacent to the pair of laterally opposing fin sidewalls 114, and forming a gate electrode 154 on or adjacent the gate dielectric layer 152, either by a gate first or a gate last process flow, as will be understood to those skilled in the art. As shown in FIG. 18, a gate spacer 156 may be deposited and patterned on the gate electrode 154 with well-known deposition and etching techniques.

It is understood that a source region and a drain region (not shown) may be formed in the indium gallium arsenide active channel 146 on opposite sides of the gate 150 or a portions of the active channel 146 may be removed on opposite sides of the gate 150 and the source region and the drain region formed in place thereof. The source and drain regions may be formed of the same conductivity type, such as p-type conductivity. In some implementations of an embodiment of the present disclosure, the source and drain regions may have the substantially the same doping concentration and profile while in other implementations they may vary. It is understood that only n-MOS are shown, p-MOS regions would be patterned and processed separately.

Figure 19:
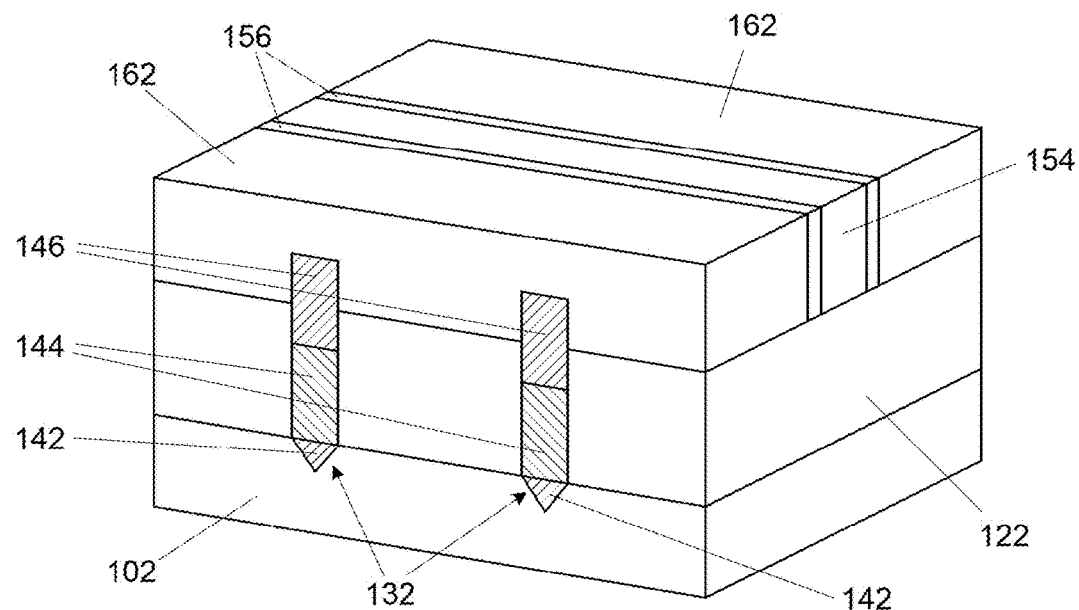
FIGS. 19-26 are oblique sectional and side cross-section views of the fabrication of an insulative buffer for an indium gallium arsenide active channel of a non-planar transistor, according to an embodiment of the present description.
Figure 20:
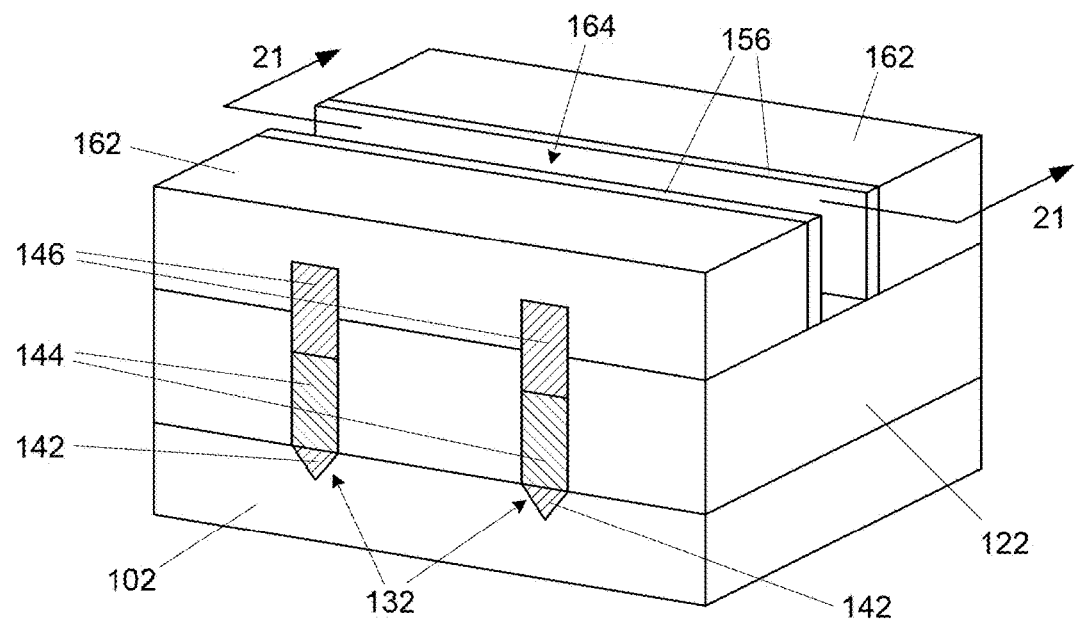
Figure 21:
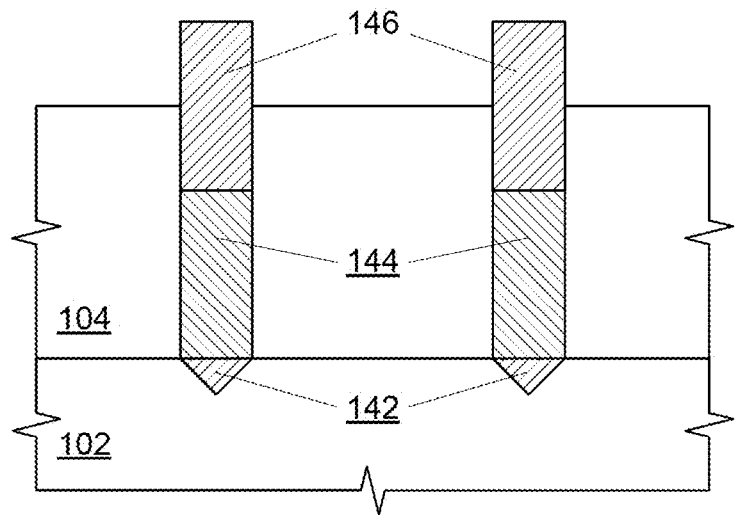

FIGS. 19-26 illustrate additional embodiments of the present description. Beginning with FIG. 18, a replacement gate process may be followed, wherein the gate dielectric 152 and the gate electrode 154 may be formed from sacrificial materials. A dielectric layer 162 may deposited over the structure of FIG. 18 and planarized to expose the sacrificial gate electrode 154, as shown in FIG. 19. The sacrificial gate electrode 154 and the gate dielectric 152 may be removed to expose the indium gallium arsenide active channel 146 between the remaining portions of the gate spacer 156 forming a exposed active channel region 146, as shown in FIGS. 20 and 21 (cross-sectional view along line 21-21 of FIG. 20 with only cross-sectioned structures shown).

Figure 22:
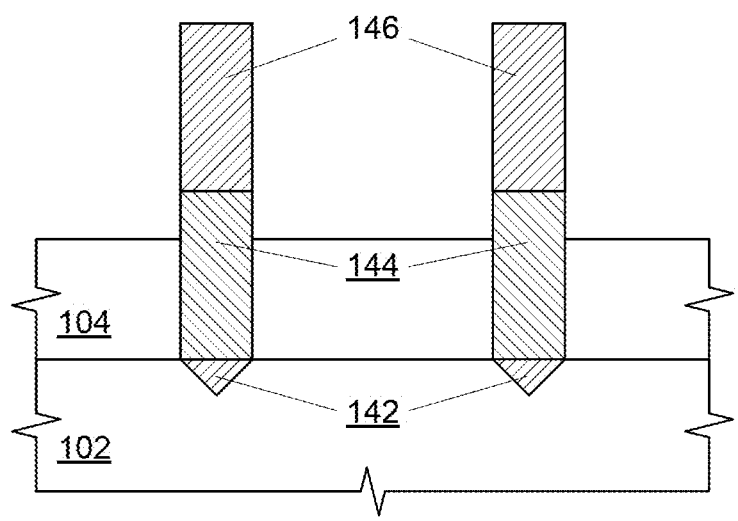
Figure 23:
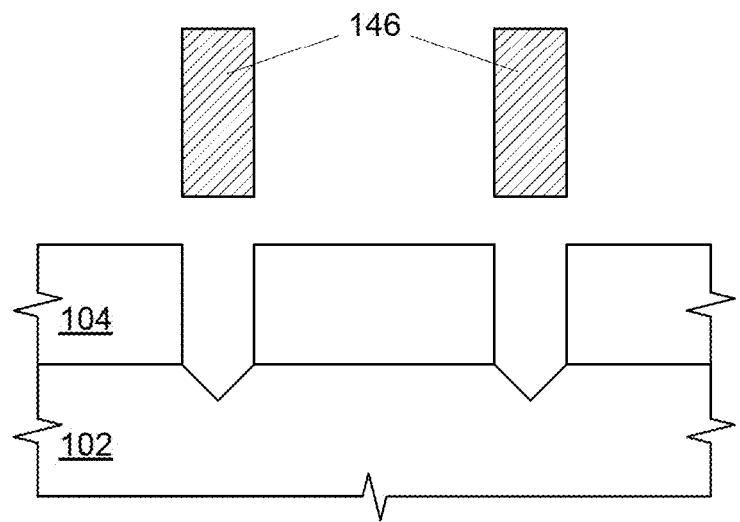

As shown in FIG. 22, the isolation structures 122 may be recessed within the exposed indium gallium arsenide active channel region 146, such as by etching, to expose a portion of the doped sub-structure 144, such that a selective etch (e.g. wet etch, dry etch, or a combination thereof) may penetrate into the doped sub-structure 144 and remove the same including the nucleation layer 142, as shown in FIG. 23.

Figure 24:
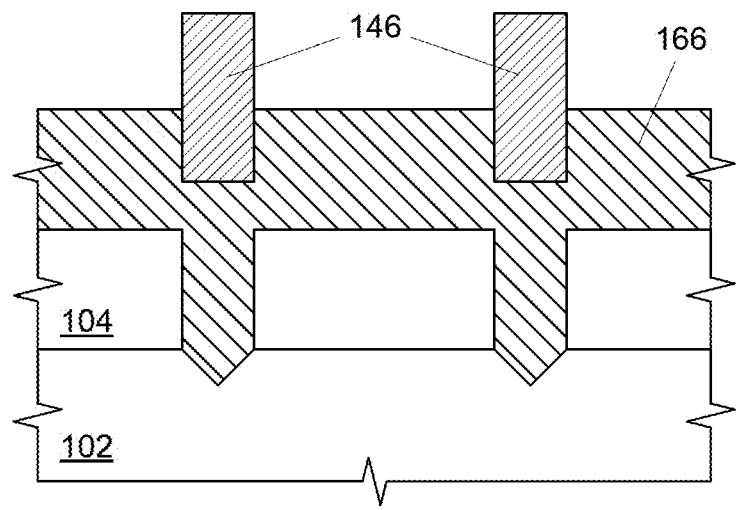
Figure 25:
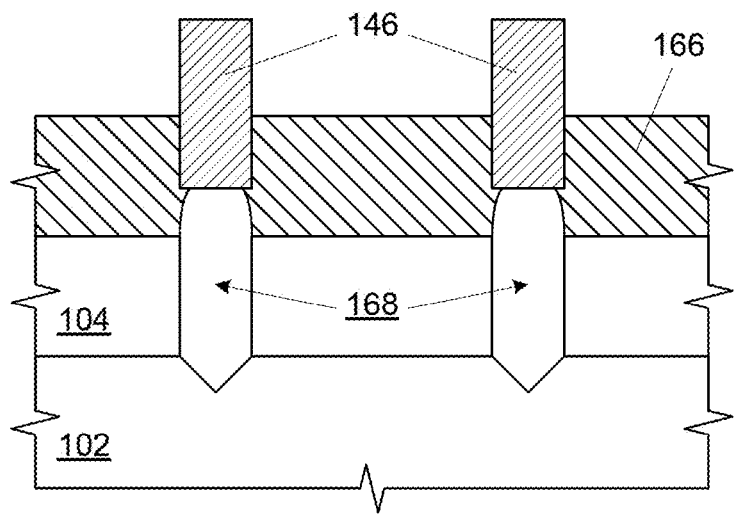
Figure 26:
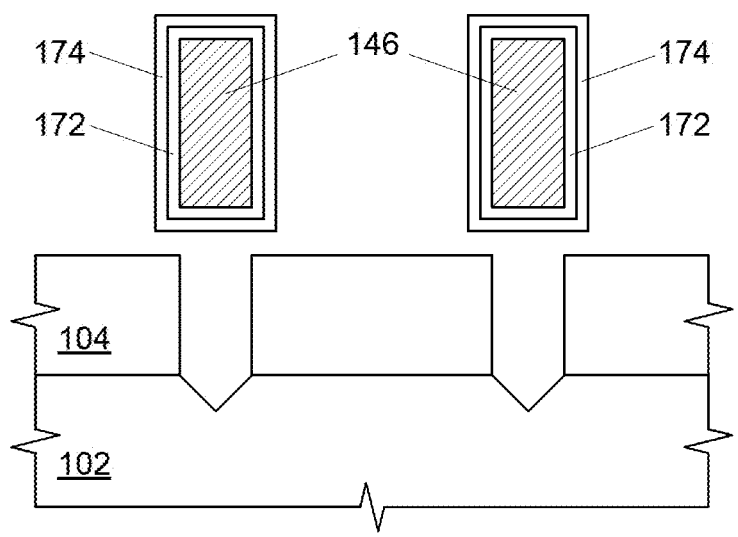

A dielectric material 166 may be deposited to fill the space left from the removal for the sub-structure 144 (see FIG. 22) and the nucleation layer 142 (see FIG. 22), as shown in FIG. 24, or to form a void 168, as shown in FIG. 25. Thereafter, the remaining components of a transistor may be formed following a known processing flow, such as a tri-gate processing flow, as will be understood to those skilled in the art. In another embodiment, as shown in FIG. 26, a gate oxide layer 172 may be formed to surround the exposed active channel 146 and a gate electrode layer 174 may be formed to surround the gate oxide layer 172 and the remaining components of a transistor may be following a known gate all-around processing flow in single or multiple wire configurations, as will also be understood to those skilled in the art.

Figure 27:
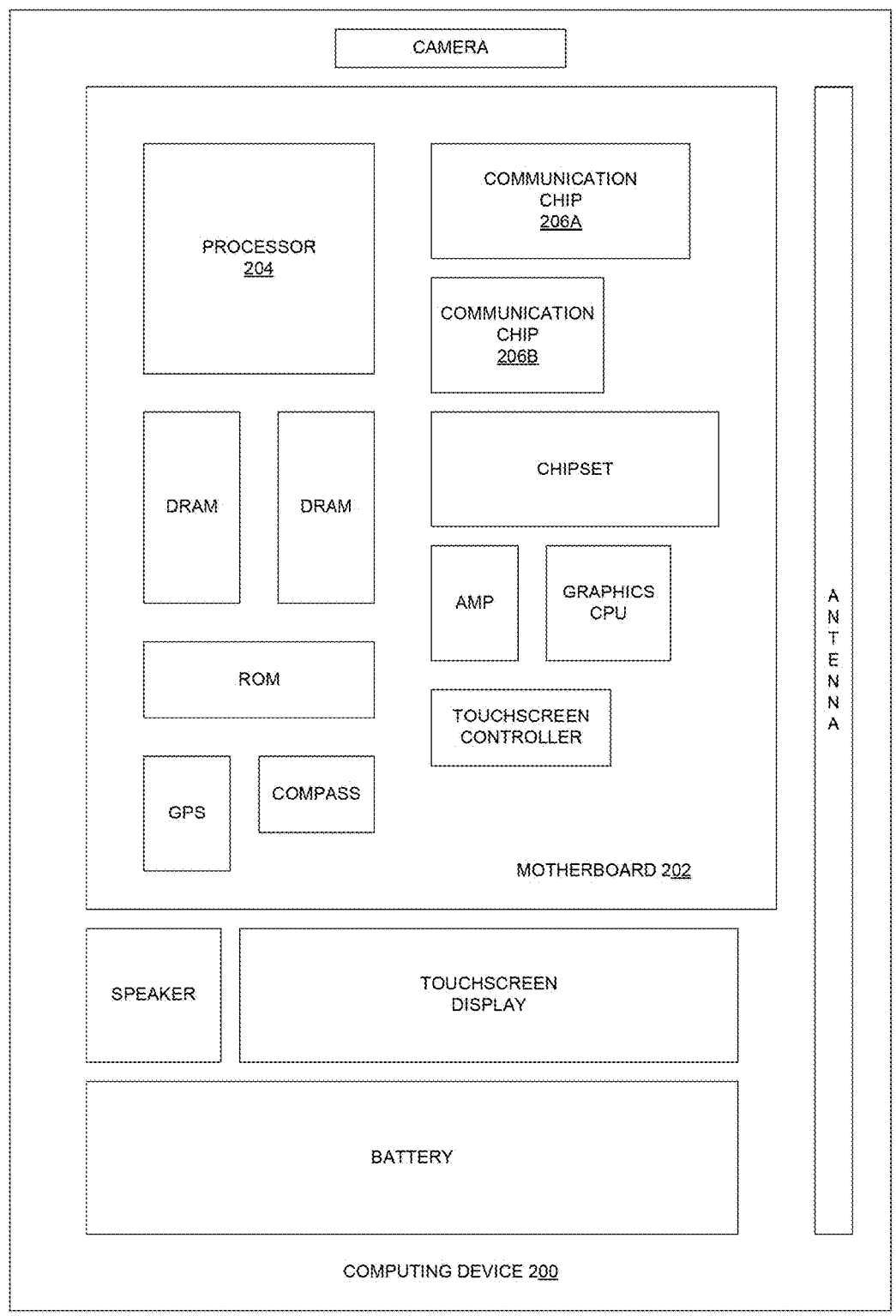
FIG. 27 illustrates a computing device in accordance with one implementation of the present description.

FIG. 27 illustrates a computing device 200 in accordance with one implementation of the present description. The computing device 200 houses a board 202. The board 202 may include a number of components, including but not limited to a processor 204 and at least one communication chip 206A, 206B. The processor 204 is physically and electrically coupled to the board 202. In some implementations the at least one communication chip 206A, 206B is also physically and electrically coupled to the board 202. In further implementations, the communication chip 206A, 206B is part of the processor 204.

Depending on its applications, the computing device 200 may include other components that may or may not be physically and electrically coupled to the board 202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 206A, 206B enables wireless communications for the transfer of data to and from the computing device 200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 200 may include a plurality of communication chips 206A, 206B. For instance, a first communication chip 206A may be dedicated to shorter range wireless communications such as Wi-Fi and Bluetooth and a second communication chip 206B may be dedicated to longer range wireless communications such as GPS, EDGE, GPRS, CDMA, WiMAX, LTE, Ev-DO, and others.

The processor 204 of the computing device 200 may include microelectronic transistors as described above. The term "processor" may refer to any device or portion of a device that processes electronic data from registers and/or memory to transform that electronic data into other electronic data that may be stored in registers and/or memory. Furthermore, the communication chip 206A, 206B may include microelectronic transistors fabricated as described above.

In various implementations, the computing device 200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 200 may be any other electronic device that processes data.

It is understood that the subject matter of the present description is not necessarily limited to specific applications illustrated in FIGS. 1-27. The subject matter may be applied to other microelectronic device and assembly applications, as well as any other appropriate transistor applications, as will be understood to those skilled in the art.

The following examples pertain to further embodiments, wherein Example 1 is a microelectronic structure having an indium gallium arsenide active channel, wherein the indium gallium arsenide active channel includes at least one surface having an indium content higher than the average indium content of the indium gallium arsenide active channel.

In Example 2, the subject matter of Example 1 can optionally include the indium gallium arsenide active channel comprising a fin having a pair of opposing surface and wherein each of the surface has an indium content higher than the average indium content of the indium gallium arsenide active channel.

In Example 3, the subject matter of Example 1 can optionally include a substrate over which the indium gallium arsenide active channel is formed.

In Example 4, the subject matter of Example 3 can optionally include the indium gallium arsenide active channel comprises a fin having a pair of opposing surface and wherein each of the surface has an indium content higher than the average indium content of the indium gallium arsenide active channel and wherein the opposing surfaces of the fin are substantially perpendicular to a first surface of the substrate.

In Example 5, the subject matter of Example 3 can optionally include a sub-structure formed between the indium gallium arsenide active channel and the substrate, wherein the sub-structure abuts the indium gallium arsenide active channel.

In Example 6, the subject matter of Example 5 can optionally include the sub-structure comprising a dopant and a material selected from the group consisting of indium gallium arsenide, indium arsenide, indium antimonide.

In Example 7, the subject matter of Example 5 can optionally include the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 8, the subject matter of Example 7 can optionally include a dopant.

In Example 9, the subject matter of Example 6 or 8 can optionally include the dopant comprises a p-type dopant.

In Example 10, the subject matter of Example 9 can optionally include the dopant being selected for the group consisting of magnesium, zinc, carbon, and beryllium.

In Example 11, the subject matter of Example 3 can optionally include an insulative buffer formed between the indium gallium arsenide active channel and the substrate.

In Example 12, the subject matter of Example 11 can optionally include the insulative buffer comprising an insulative material.

In Example 13, the subject matter of Example 11 can optionally include the insulative buffer comprising a void.

In Example 14, the subject matter of Example 3 can optionally include a nucleation trench extending into the substrate and a nucleation layer abutting the nucleation trench.

In Example 15, the subject matter of Example 14 can optionally include the nucleation trench comprising a nucleation trench having (111) faceting.

In Example 16, the subject matter of Example 14, can optionally include the nucleation layer comprises a material selected from the group consisting of indium phosphide, gallium phosphide, and gallium arsenide.

The following examples pertain to further embodiments, wherein Example 17 is a method of fabricating a microelectronic structure, comprising forming at least one fin on a substrate, wherein the at least one fin comprises a pair of opposing sidewalls extending from the substrate; forming isolation structures abutting each of the fin sidewalls; forming a trench by removing the at least one fin, wherein the trench has a height of between about 50 to 500 nm and a width of less than about 50 nm; and forming an indium gallium arsenide active channel within the trench, wherein surfaces indium gallium arsenide active channel abutting the trench have an indium content higher than the average indium content of the indium gallium arsenide active channel.

In Example 18, the subject matter of Example 17 can optionally include forming a sub-structure formed between the indium gallium arsenide active channel and the substrate, wherein the sub-structure abuts the indium gallium arsenide active channel.

In Example 19, the subject matter of Example 18 can optionally include forming the sub-structure comprises forming the sub-structure including a dopant and a material selected from the group consisting of indium gallium arsenide, indium arsenide, indium antimonide.

In Example 20, the subject matter of Example 18 can optionally include forming the sub-structure comprises forming the sub-structure from a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

In Example 21, the subject matter of Example 20 can optionally include forming the sub-structure with a dopant.

In Example 22, the subject matter of Example 19 or 21 can optionally include the dopant comprises a p-type dopant.

In Example 23, the subject matter of Example 22 can optionally include forming the sub-structure with a p-dopant being selected for the group consisting of magnesium, zinc, carbon, and beryllium.

In Example 24, the subject matter of Example 17 can optionally include forming an insulative buffer between the indium gallium arsenide active channel and the substrate.

In Example 25, the subject matter of Example 24 can optionally include forming the insulative buffer comprising an insulative material or a void.

In Example 26, the subject matter of Example 17 can optionally include forming a nucleation trench extending into the substrate and forming a nucleation layer abutting the nucleation trench.

In Example 27, the subject matter of Example 26 can optionally include forming the nucleation trench comprising forming a nucleation trench having (111) faceting.

In Example 28, the subject matter of Example 26 can optionally include forming the nucleation layer from a material selected from the group consisting of indium phosphide, gallium phosphide, and gallium arsenide.

The following examples pertain to further embodiments, wherein Example 29 is an electronic system, comprising a board; and a microelectronic device attached to the board, wherein the microelectronic device includes at least one transistor comprising an indium gallium arsenide active channel, wherein the indium gallium arsenide active channel includes at least one surface having an indium content higher than the average indium content of the indium gallium arsenide active channel.

In Example 30, the subject matter of any of Example 29 can optionally include the indium gallium arsenide active channel comprises a fin having a pair of opposing surface and wherein each of the surface has an indium content higher than the average indium content of the indium gallium arsenide active channel.

Having thus described in detail embodiments of the present description, it is understood that the present description defined by the appended claims is not to be limited by particular details set forth in the above description, as many apparent variations thereof are possible without departing from the spirit or scope thereof.

The invention claimed is:

1. A microelectronic structure comprising:
a substrate having a first surface; and
an indium gallium arsenide active channel, wherein the indium gallium arsenide active channel comprises a fin having a pair of opposing surfaces that are substantially perpendicular to the first surface of the substrate, wherein each of the surfaces has an indium content higher than the average indium content of the indium gallium arsenide active channel, and wherein the indium content of the indium gallium arsenide active channel is graded between a higher indium content at each of the pair of opposing surfaces to a lower indium content at a center region between the pair of opposing surfaces.

2. The microelectronic structure of claim 1, further including a sub-structure formed between the indium gallium arsenide active channel and the substrate, wherein the sub-structure abuts the indium gallium arsenide active channel.

3. The microelectronic structure of claim 2, wherein the sub-structure comprises a dopant and a material selected from the group consisting of indium gallium arsenide, indium arsenide, indium antimonide.

4. The microelectronic structure of claim 2, wherein the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

5. The microelectronic structure of claim 4, further including a dopant within the sub-structure.

6. The microelectronic structure of claim 5, wherein the dopant comprises a p-type dopant selected from the group consisting of magnesium, zinc, carbon, and beryllium.

7. The microelectronic structure of claim 1, further including an insulative buffer formed between the indium gallium arsenide active channel and the substrate.

8. The microelectronic structure of claim 1, further including a nucleation trench extending into the substrate and a nucleation layer abutting the nucleation trench.

9. The microelectronic structure of claim 8, wherein the nucleation trench comprises a nucleation trench having (111) faceting.

10. The microelectronic structure of claim 8, wherein the nucleation layer comprises a material selected from the group consisting of indium phosphide, gallium phosphide, and gallium arsenide.

11. An electronic system, comprising:
a board; and
a microelectronic device attached to the board, wherein the microelectronic device includes at least one microelectronic structure comprising:
a substrate having a first surface; and
an indium gallium arsenide active channel, wherein the indium gallium arsenide active channel comprises a fin having a pair of opposing surfaces that are substantially perpendicular to the first surface of the substrate, wherein each of the surfaces has an indium content higher than the average indium content of the indium gallium arsenide active channel, and wherein the indium content of the indium gallium arsenide active channel is graded between a higher indium content at each of the pair of opposing surfaces to a lower indium content at a center region between the pair of opposing surfaces.

12. The electronic system of claim 11, further including a sub-structure formed between the indium gallium arsenide active channel and the substrate, wherein the sub-structure abuts the indium gallium arsenide active channel.

13. The electronic system of claim 12, wherein the sub-structure comprises a dopant and a material selected from the group consisting of indium gallium arsenide, indium arsenide, indium antimonide.

14. The electronic system of claim 12, wherein the sub-structure comprises a material selected from the group consisting of indium aluminum arsenide, indium phosphide, gallium phosphide, gallium arsenide, gallium arsenide antimonide, aluminum arsenide antimonide, indium aluminum gallium arsenide, indium aluminum gallium phosphide, and aluminum gallium arsenide.

15. The electronic system of claim 14, further including a dopant within the sub-structure.

16. The electronic system of claim 15, wherein the dopant comprises a p-type dopant selected from the group consisting of magnesium, zinc, carbon, and beryllium.

17. The electronic system of claim 11, further including an insulative buffer formed between the indium gallium arsenide active channel and the substrate.

18. The electronic system of claim 11, further including a nucleation trench extending into the substrate and a nucleation layer abutting the nucleation trench.

19. The electronic system of claim 18, wherein the nucleation trench comprises a nucleation trench having (111) faceting.

* * * * *